(12) United States Patent
Fukuda et al.

(10) Patent No.: US 8,603,361 B2
(45) Date of Patent: *Dec. 10, 2013

(54) FLUORESCENT SUBSTANCE AND LIGHT-EMITTING DEVICE EMPLOYING THE SAME

(75) Inventors: Yumi Fukuda, Tokyo (JP); Hironori Asai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/471,864

(22) Filed: May 15, 2012

(65) Prior Publication Data

US 2012/0229016 A1  Sep. 13, 2012

Related U.S. Application Data

(63) Continuation of application No. 12/504,180, filed on Jul. 16, 2009.

(30) Foreign Application Priority Data

Jul. 31, 2008  (JP) ................................. 2008-197685

(51) Int. Cl.
*C09K 11/56* (2006.01)
*C09K 11/64* (2006.01)

(52) U.S. Cl.
USPC .................................. 252/301.4 F; 313/486

(58) Field of Classification Search
USPC .................................. 252/301.4 F; 313/486
See application file for complete search history.

(56) References Cited

U.S. PATENT DOCUMENTS

| | | | | |
|---|---|---|---|---|
| 8,278,821 B2* | 10/2012 | Ishida et al. | ................. | 313/506 |
| 8,310,145 B2* | 11/2012 | Mitsuishi et al. | ............ | 313/503 |
| 8,414,145 B2* | 4/2013 | Mitsuishi et al. | ............ | 362/231 |
| 2009/0096361 A1 | 4/2009 | Fukuda et al. | | |

FOREIGN PATENT DOCUMENTS

| | | |
|---|---|---|
| JP | 2005-255895 | 9/2005 |
| WO | WO 2006/093298 A1 | 9/2006 |
| WO | WO 2009/031495 A1 | 3/2009 |

OTHER PUBLICATIONS

Fukuda et al, "Luminescence Properties of Eu2+-Doped Green-Emitting Sr-Sialon Phosphor and Its Application in White LEDs", Proceedings of the 15th display Workshop, Dec. 4, 2008, p. 114, PH1-2.*

(Continued)

*Primary Examiner* — Carol M Koslow
(74) *Attorney, Agent, or Firm* — Oblon, Spivak, McClelland, Maier & Neustadt, L.L.P.

(57) ABSTRACT

Provided is a fluorescent substance excellent in quantum efficiency and in temperature characteristics, and a light-emitting device utilizing the fluorescent substance. This fluorescent substance contains an inorganic compound comprising a metal element M, a trivalent element $M^1$ other than the metal element M, a tetravalent element $M^2$ other than the metal element M, and either or both of O and N. In the inorganic compound, the metal element M is partly replaced with a luminescence center element R. The crystal structure of the fluorescent substance is basically the same as $Sr_3Al_3Si_{13}O_2N_{21}$, but the chemical bond lengths of $M^1$-N and $M^2$-N are within the range of ±15% based on those of Al—N and Si—N calculated from the lattice constants and atomic coordinates of $Sr_3Al_3Si_{13}O_2N_{21}$, respectively. The fluorescent substance emits luminescence having a peak in the range of 490 to 580 nm when excited with light of 250 to 500 nm.

20 Claims, 5 Drawing Sheets

(56) References Cited

OTHER PUBLICATIONS

Fukuda et al, "Luminescence Properties of Eu2+-Doped Green-Emitting Sr-Sialon Phosphor and Its Application in White Light-Emitting Diodes", Applied Physics Express 2, (2009) 012401-1 to 012401-3, published online Dec. 26, 2008.*

Naoto Hirosaki et al., "Characterization and properties of green-emitting β-SiAlON: $EU^{2+}$ powder phosphors for white light-emitting diodes", Applied Physics Letters 86, 211905, 2005, 3 pages.

Naoto Hirosaki et al., Extended Abstracts (The 53th Spring Meeting); The Japan Society of Applied Physics and Related Societies, 25p-ZR-11, 2006, 1 page.

Kyota Uheda et al., "Synthesis and Characterization of New Green Phosphor for White LED", Proc. of 14$^{th}$ International Display Workshops 2007, pp. 899-902.

T. Hahn, International Tables of Crystallography, vol. A: Space-group symmetry, pp. 196-197.

Japanese Office Action issued Sep. 28, 2010, in Japanese Patent Application No. 2008-197685 (with English-language translation).

Japanese Office Action issued Sep. 28, 2010, in Japanese Patent Application No. 2010-183191 (with English-language translation).

Fukuda et al., "Luminescence Properties of Eu2+-Doped Green-Emitting Sr-Sialon Phosphor and its Application in White LEDs", Proceedings of the 15$^{th}$ display Workshop, Dec. 4, 2008, p. 114, PH1-2.

Fukuda et al., "Luminescence Properties of Eu2+-Doped Green-Emitting Sr-Sialon Phosphor and its Application in White Light-Emitting Diodes", Applied Physics Express 2, (2009) 012401-3, published online Dec. 26, 2008.

Information Statement Sheet issued Jul. 27, 2011 in Japanese Patent Application No. 2008-197685 (with English translation).

Information Statement Sheet issued Jul. 27, 2011 in Japanese Patent Application No. 2010/183191 (with English translation).

Office Action issued on Feb. 4, 2011, in Japanese Patent Application No. 2008-197685 (with English translation).

Office Action issued on Feb. 4, 2011, in Japanese Patent Application No. 2010-183191 (with English translation).

Office Action issued Dec. 7, 2012 in Japanese Patent Application No. 2008-197685 with English language translation.

Office Action issued Dec. 7, 2012 in Japanese Patent Application No. 2010-183191 with English language translation.

Japanese Office Action issued Apr. 2, 2013 in Patent Application No. 2011-103135 with English Translation.

* cited by examiner

FLUORESCENT SUBSTANCE AND LIGHT-EMITTING DEVICE EMPLOYING THE SAME

CROSS REFERENCE TO RELATED APPLICATIONS

The present application is a continuing application base on U.S. application Ser. No. 12/504,180, filed on Jul. 16, 2009, and claiming the benefit of the filing date of Japanese Application No. 2008-197685, filed on Jul. 31, 2008, the text of each of which is incorporated by reference.

BACKGROUND OF THE INVENTION

1. Field of the Invention

The present invention relates to a fluorescent substance usable in a display such as a field emission display or in a light-emitting device comprising a blue or ultraviolet LED as a light source.

2. Background Art

LED lamps, which utilize light-emitting diodes, are used in many displaying elements of instruments such as mobile devices, PC peripheral equipments, OA equipments, various kinds of switches, light sources for backlighting, and indicating boards. The LED lamps are strongly required not only to have high efficiency, but also to be excellent in color rendition when used for general lighting or to deliver a wide color gamut when used for backlighting. In order to increase the efficiency, it is necessary to adopt a highly efficient fluorescent substance. Further, for improving the color rendition and for broadening the color gamut, it is effective to adopt a fluorescent substance that emits green luminescence under the excitation with blue light.

Incidentally, high load LEDs generally become so hot while working that fluorescent substances used therein are heated up to a temperature of approx. 100 to 200° C. When the fluorescent substances are thus heated, their emission intensity is generally lowered. Accordingly, it is desired that the emission intensity be less lowered even if the fluorescent substances are heated.

In view of the above, an Eu-activated β-SiAlON phosphor can be regarded as an example of the fluorescent substances which emit green luminescence under the excitation with blue light and which are suitably used for the aforementioned LED lamps. This phosphor emits luminescence efficiently when excited at 450 nm, and its absorption ratio, inner quantum efficiency and emission efficiency under the excitation at 450 nm are approx. 65%, 53% and 35%, respectively (JP-A 2005-255895(KOKAI)). These are also reported in N. Hirosaki et al., Extended Abstracts (The 53$^{rd}$ Spring meeting); The Japan Society of Applied physics and Related Societies, 25p-ZR-11 (2006).

Meanwhile, a lot of energetic work has recently been devoted to development of flat panel displays, and the development has put emphasis on the study of PDPs (plasma displays) and LCDs (liquid crystal displays). However, field emission displays are expected to give much clearer images and hence to be more advantageous than the PDPs and LCDs.

The field emission display comprises a screen on which red, green and blue fluorescent substances are arranged, and a cathode spaced apart from and facing to the screen. The space between the screen and the cathode is smaller than that in a CRT. The cathode includes plural emitter elements as electron sources, which emit electrons in accordance with potential difference between the emitter elements and gate electrodes placed nearby. The electrons thus emitted are accelerated by an anode voltage (accelerating voltage) applied on the fluorescent substance side, and then made to impinge against the fluorescent substances, so that the fluorescent substances give off luminescence to display a clear image.

As for the fluorescent substances used in the field emission display constituted as described above, it is required to have sufficiently high emission efficiency and to exhibit the high emission efficiency fully even when saturation is achieved by excitation with a high current density. From the viewpoint of only this requirement, sulfide phosphors (e.g., ZnS:Cu, ZnS:Ag), which are conventionally used as fluorescent substances for CRTs, may be considered as prospective candidates for the fluorescent substances usable in the field emission display. However, it is reported that the sulfide phosphors such as ZnS decompose under the condition where a low-energy cathode ray display screen is excited. This is a serious problem because the decomposed products thus generated badly degrade a heat filament, from which electron beams are emitted. Further, conventionally used ZnS-based blue fluorescent substances are more liable to deteriorate in luminance as compared with red and green fluorescent substances. This raises another problem that colors in displayed color images gradually fade or change with time.

SUMMARY OF THE INVENTION

A fluorescent substance according to one aspect of the present invention contains an inorganic compound which comprises a metal element M, an element $M^1$ selected from the group of trivalent elements other than said metal element M, an element $M^2$ selected from the group of tetravalent elements other than said metal element M, and either or both of O and N, provided that said metal element M is partly replaced with a luminescence center element R; and is characterized in that the chemical bond lengths of $M^1$-N and $M^2$-N calculated from the lattice constants and atomic coordinates of the crystal structure in said fluorescent substance are within the range of ±15% based on those of Al—N and Si—N calculated from the lattice constants and atomic coordinates of $Sr_3Al_3Si_{13}O_2N_{21}$, respectively.

Further, a fluorescent substance according to another aspect of the present invention is characterized by having a composition represented by the following formula (1):

$$(M_{1-x}R_x)_{3-y}Al_{3+z}Si_{13-z}O_{2+u}N_{21-w} \quad (1)$$

in which M is an element selected from the IA group elements, the IIA group elements, the IIIA group elements, the IIIB group elements, the rare earth elements and the IVA group elements; R is another element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe; and x, y, z, u and w are numbers satisfying the conditions of 0<x≤1, −0.1≤y≤0.15, −1≤z≤1, and −1<u-w≤1, respectively; and by emitting luminescence having a peak in the wavelength range of 490 to 580 nm when excited with light in the wavelength range of 250 to 500 nm.

Furthermore, a process for preparation of the fluorescent substance according to the present invention is characterized in that a nitride or carbide of said metal element M, a nitride, oxide or carbide of said element $M^1$, a nitride, oxide or carbide of said element $M^2$, and an oxide, nitride or carbonate of said luminescence center element R are mixed as starting materials and then fired.

Still further, a light-emitting device according to the present invention is characterized by comprising a light-emitting element giving off light in the wavelength range of 250 to 500 nm, and a phosphor layer which is provided on said light-emitting element and which contains the above fluorescent substance.

The present invention provides a fluorescent substance having excellent quantum efficiency and hence giving high emission intensity. This emission intensity is prevented from lowering even if the temperature is elevated, and accordingly the fluorescent substance according to the present invention is very practical.

DETAILED DESCRIPTION OF THE INVENTION

Figure 1:
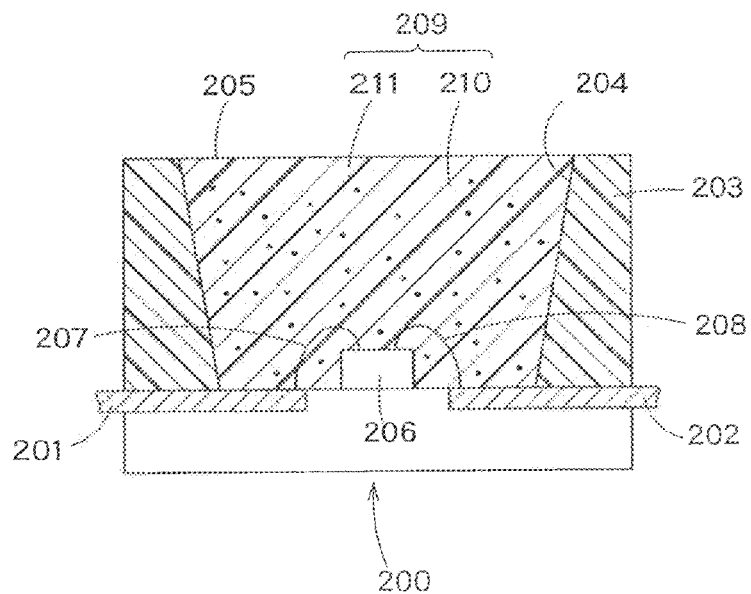
FIG. 1 is a schematic cross-sectional view of the light-emitting device utilizing a fluorescent substance according to one aspect of the present invention.

The present inventors have found that a fluorescent substance excellent both in quantum efficiency and in temperature characteristics can be obtained by incorporating a luminescence center element into an oxynitride compound having a particular crystal structure and a specific composition. The fluorescent substance according to the present invention is essentially based on an inorganic compound which has the same crystal structure as $Sr_3Al_3Si_{13}O_2N_{21}$ and which comprises a metal element M, an element $M^1$ selected from the group of trivalent elements, an element $M^2$ selected from the group of tetravalent elements, and either or both of O and N. In the fluorescent substance of the present invention, the metal element M participating in the crystal structure of the inorganic compound is partly replaced with a luminescence center element R.

The metal element M is preferably selected from the IA (alkali metal) group elements such as Li, Na and K; the IIA (alkaline earth metal) group elements such as Mg, Ca, Sr and Ba; the IIIA group elements such as B, Ga and In; the IIIB group elements such as Y and Sc; the rare earth elements such as Gd, La and Lu; and the IVA group elements such as Ge. The metal element M may be either a single element or a combination of two or more elements.

The element $M^1$ is different from the metal element M, and is selected from the group of trivalent elements. The trivalent elements are preferably selected from the IIIA group elements and the IIIB group elements. Concrete examples of the element $M^1$ include Al, B, Ga, In, Sc, Y, La, Gd and Lu. The element $M^1$ may be either a single element or a combination of two or more elements.

The element $M^2$ is different from the metal element M, and is selected from the group of tetravalent elements. The tetravalent elements are preferably selected from the IVA group elements and the IVB group elements. Concrete examples of the element $M^2$ include Si, Ge, Sn, Ti, Zr and Hf. The element $M^2$ may be either a single element or a combination of two or more elements.

In the above, some elements are repeatedly included in the examples of the metal element M and the elements $M^1$ and $M^2$. However, the elements $M^1$ and $M^2$ in the fluorescent substance of the present invention are so selected that they are different from the metal element M.

The fluorescent substance according to the present invention has a crystal structure basically comprising the elements M, $M^1$, $M^2$ and O and/or N, but it is necessary that the metal element M be partly replaced with a luminescence center element R.

Examples of the luminescence center element R include Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe. Among them, either or both of Eu and Mn can be preferably selected in consideration of emission wavelength variability and the like.

Preferably, 0.1 mol % or more of the metal element M is replaced with the luminescence center element R. If the amount of the replaced M is less than 0.1 mol %, it is difficult to obtain sufficient emission intensity. The metal element M can be completely replaced with the luminescence center element R. However, if the amount of the replaced M is less than 50 mol %, the decrease of emission probability (concentration quenching) can be prevented to the utmost. The luminescence center element enables the fluorescent substance of the present invention to emit light in the range of bluish green to yellowish green, namely, to give off luminescence having a peak in the wavelength range of 490 to 580 nm under the excitation with light of 250 to 500 nm.

The fluorescent substance according to the present invention can be considered based on $Sr_3Al_3Si_{13}O_2N_{21}$, but its constituting elements Sr, Si, Al, O and N are replaced with other elements and/or the $Sr_3Al_3Si_{13}O_2N_{21}$ matrix is fused with other metal elements such as Eu to form a solid solution. These modifications such as replacement change the lattice constants, and thereby the crystal structure is often slightly changed. However, the atomic positions therein, which depend on such conditions as the crystal structure, the sites occupied by the atoms therein and their atomic coordinates, are seldom changed so greatly that the chemical bonds among the skeleton atoms are broken. This means that the fluorescent substance of the present invention can give the effect of the present invention without changing the fundamental crystal structure. In the present invention, it is considered that the fundamental crystal structure is not changed as long as the modification is to the extent described below. In the case where the chemical bond lengths (close interatomic distances) of $M^1$-N and $M^2$-N calculated from the lattice constants and atomic coordinates determined by X-ray diffraction or neutron diffraction are within the range of ±15% based on those of Al—N and Si—N calculated from the lattice constants and atomic coordinates (shown in Table 1) of $Sr_3Al_3Si_{13}O_2N_{21}$, respectively, the fundamental crystal structure is thought not to be changed in the present invention. Accordingly, it is indispensable for the fluorescent substance of the present invention to have the above crystal structure. If the chemical bond lengths are changed more than the above, they are broken to form another crystal structure and hence the effect of the present invention cannot be obtained.

TABLE 1

| | Site | SOF* | x | y | z |
|---|---|---|---|---|---|
| Sr1 | 4a | 1 | 0.2500 | 0.0000 | 0.1238(9) |
| Sr2 | 4a | 1 | 0.7667(11) | 0.1679(10) | 0.1312(8) |
| Sr3 | 4a | 1 | 0.7667(11) | 0.1679(10) | 0.6312(8) |
| Si1 | 4a | 0.5 | 0.0857(6) | 0.5274(3) | 0.2435(3) |
| Si2 | 4a | 0.5 | 0.4143(6) | 0.4726(3) | 0.2435(3) |
| Si3 | 4a | 0.5 | 0.0667(7) | 0.4709(4) | 0.2788(4) |
| Si4 | 4a | 0.5 | 0.4333(7) | 0.5291(4) | 0.2788(4) |
| Si5 | 4a | 1 | 0.1015(3) | 0.4497(2) | 0.0665(2) |
| Si6 | 4a | 1 | 0.3985(3) | 0.5503(2) | 0.0665(2) |
| Si7 | 4a | 1 | 0.9397(3) | 0.3398(2) | 0.2221(2) |
| Si8 | 4a | 1 | 0.5603(3) | 0.6602(2) | 0.2221(2) |
| Si9 | 4a | 1 | 0.0866(3) | 0.1586(2) | 0.2440(2) |
| Si10 | 4a | 1 | 0.4134(3) | 0.8414(2) | 0.2440(2) |
| Si11 | 4a | 1 | 0.9007(3) | 0.1506(2) | 0.4277(2) |
| Si12 | 4a | 1 | 0.5993(3) | 0.8494(2) | 0.4277(2) |
| Si13 | 4a | 1 | 0.9038(3) | 0.3520(19) | 0.4313(2) |
| Si14 | 4a | 1 | 0.5962(3) | 0.6480(19) | 0.4313(2) |
| Si15 | 4a | 1 | 0.1025(3) | 0.0525(19) | 0.0691(2) |
| Si16 | 4a | 1 | 0.3975(3) | 0.9475(19) | 0.0691(2) |
| Si17 | 4a | 1 | 0.6052(3) | 0.2491(2) | 0.4346(2) |
| Si18 | 4a | 1 | 0.8948(3) | 0.7509(8) | 0.4346(2) |
| N1 | 4a | 1 | 0.9936(9) | 0.3559(8) | 0.3289(6) |
| N2 | 4a | 1 | 0.5064(9) | 0.6441(8) | 0.3289(6) |
| N3 | 4a | 1 | 0.2500 | 0.5000 | 0.2960(1) |
| N4 | 4a | 1 | 0.0171(10) | 0.4419(5) | 0.1733(6) |
| N5 | 4a | 1 | 0.4829(10) | 0.5581(5) | 0.1733(6) |
| N6 | 4a | 1 | 0.7456(8) | 0.6671(7) | 0.2049(6) |
| N7 | 4a | 1 | 0.7544(8) | 0.3329(7) | 0.2049(6) |
| N8 | 4a | 1 | 0.2110(2) | 0.5458(11) | 0.0630(1) |
| N9 | 4a | 1 | 0.4760(18) | 0.4535(14) | 0.0120(1) |
| N10 | 4a | 1 | 0.5322(19) | 0.5488(11) | 0.4870(1) |
| N11 | 4a | 1 | 0.5320(2) | 0.7498(14) | 0.4870(1) |
| N12 | 4a | 1 | 0.7943(18) | 0.2494(11) | 0.4400(1) |
| N13 | 4a | 1 | 0.4706(19) | 0.8488(11) | 0.0100(1) |
| N14 | 4a | 1 | 0.7901(18) | 0.8475(16) | 0.4500(1) |
| N15 | 4a | 1 | 0.5442(19) | 0.1508(12) | 0.4920(1) |
| N16 | 4a | 1 | 0.0407(11) | 0.0624(6) | 0.1785(6) |
| N17 | 4a | 1 | 0.4593(11) | 0.9376(6) | 0.1785(6) |
| N18 | 4a | 1 | 0.0514(12) | 0.6421(7) | 0.1812(7) |
| N19 | 4a | 1 | 0.0316(12) | 0.2506(7) | 0.1742(6) |
| N20 | 4a | 1 | 0.7881(19) | 0.6483(12) | 0.4380(1) |
| N21 | 4a | 1 | 0.7897(17) | 0.4504(10) | 0.4460(1) |
| N22 | 4a | 1 | 0.4486(12) | 0.3579(7) | 0.1812(7) |
| N23 | 4a | 1 | 0.4684(12) | 0.7494(7) | 0.1742(6) |

Remark)
SOF*: site occupation factor

An example of the fluorescent substance according to the present invention is represented by the following formula (1):

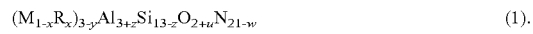

$(M_{1-x}R_x)_{3-y}Al_{3+z}Si_{13-z}O_{2+u}N_{21-w}$ (1).

In the formula (1), M and R are the same as described above and x, y, z, u and w are numbers satisfying the conditions of $0<x\leq1$, $-0.1\leq y\leq0.15$, $-1\leq z\leq1$ and $-1<u-w\leq1$, respectively. These conditions are preferably $0.001\leq x\leq0.5$, $-0.09\leq y\leq0.07$, $0.2\leq z\leq1$ and $-0.1\leq u-w\leq0.3$, respectively.

The fluorescent substance of the present invention is based on an inorganic compound having essentially the same crystal structure as $Sr_3Al_3Si_{13}O_2N_{21}$ provided that the constituting elements are partly replaced with luminous elements and that their contents are restricted in the predetermined ranges, whereby the fluorescent substance can have excellent quantum efficiency.

Figure 2:
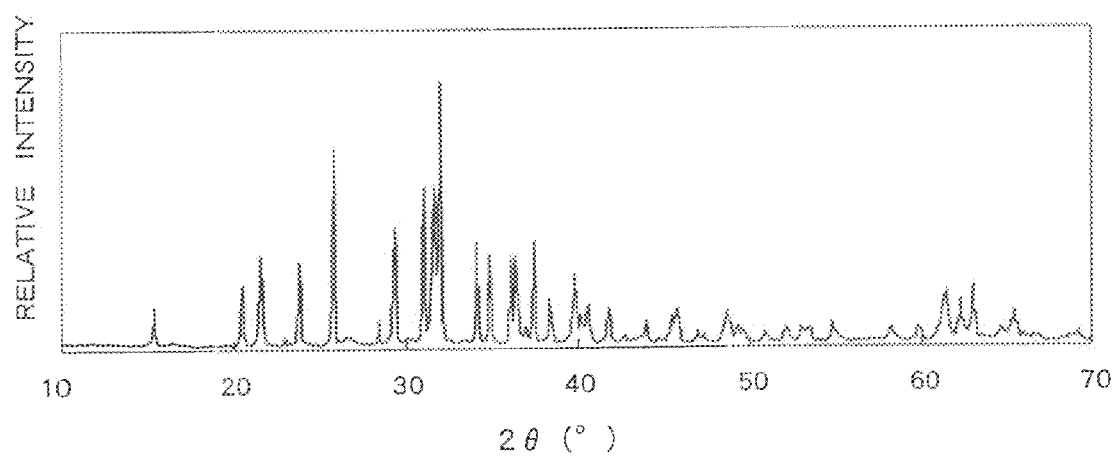
FIG. 2 is an XRD profile of a fluorescent substance (Example 1) having the $Sr_3Al_3Si_{13}O_2N_{21}$ crystal structure.
Figure 3A:
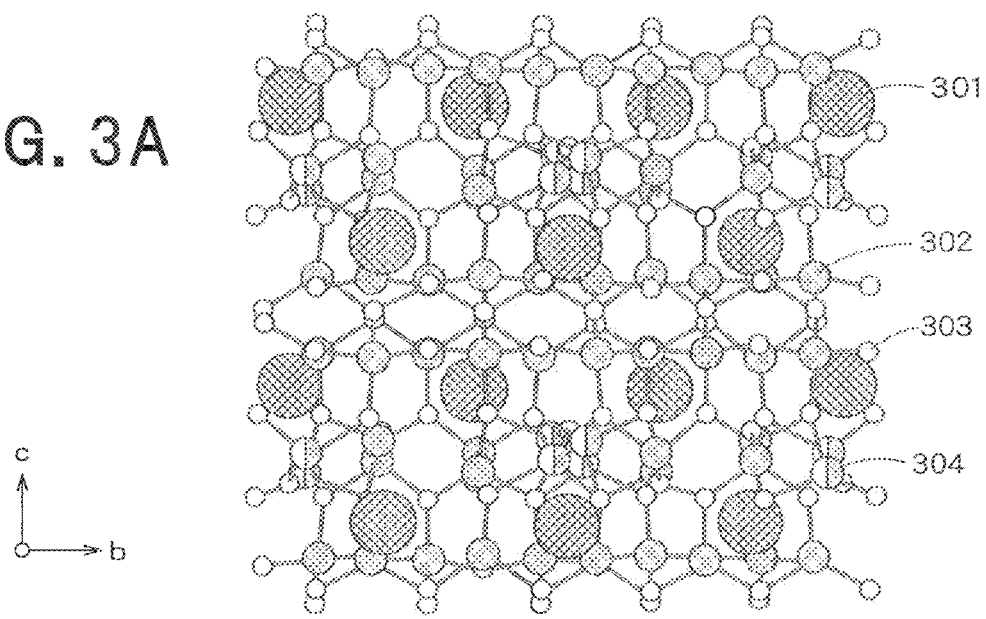
FIG. 3A is a projection of the typical $Sr_3Al_3Si_{13}O_2N_{21}$ crystal structure along the a axis, wherein 301 is Sr, 302 is Si, 303 is O or N, and 304 is Al.
Figure 3B:
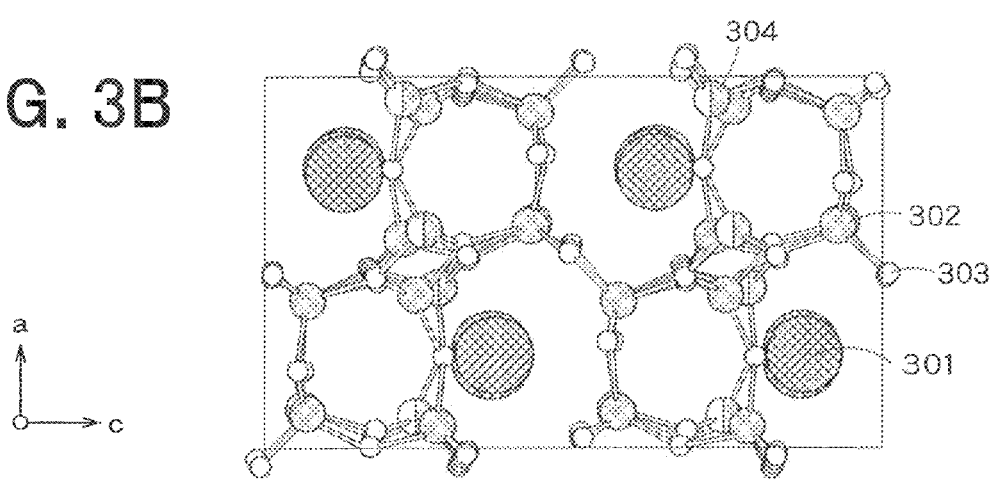
FIG. 3B is a projection of the typical $Sr_3Al_3Si_{13}O_2N_{21}$ crystal structure along the b axis, wherein 301 is Sr, 302 is Si, 303 is O or N, and 304 is Al.
Figure 3C:
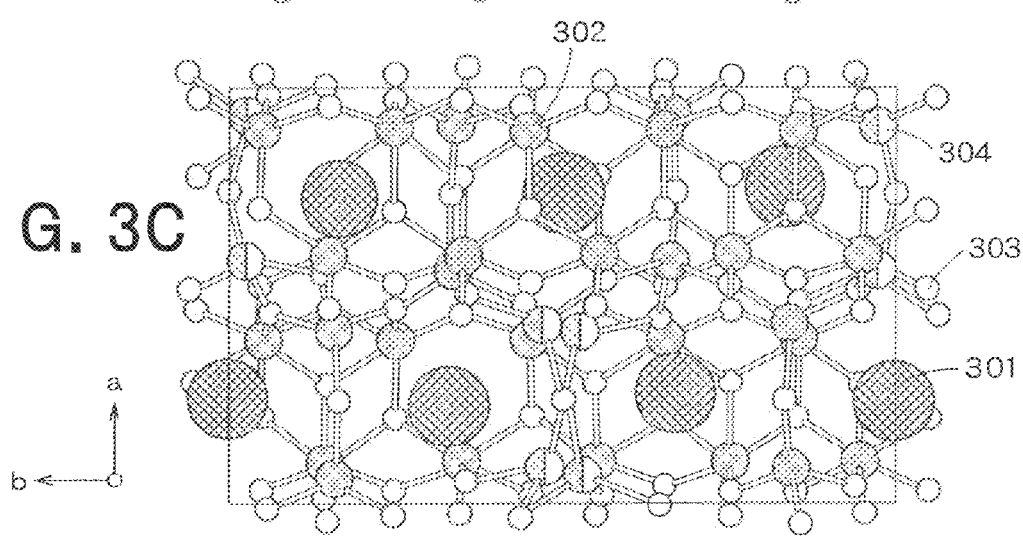
FIG. 3C is a projection of the typical $Sr_3Al_3Si_{13}O_2N_{21}$ crystal structure along the c axis, wherein 301 is Sr, 302 is Si, 303 is O or N, and 304 is Al.

The typical crystal structure of $Sr_3Al_3Si_{13}O_2N_{21}$ belongs to an orthorhombic system with lattice constants of a=9.037(6) Å, b=14.734(9) Å and c=14.928(10) Å, and gives an XRD profile shown in FIG. 2. This crystal belongs to the space group $P2_12_12_1$ (which is the 19$^{th}$ space group listed in International Table for Crystallography, Volume A: Space-group symmetry, Edited by T. Hahn, Springer (Netherlands)). Generally, according to single crystal XRD, it can be determined what space group the crystal belongs to. The typical crystal structure of $Sr_3Al_3Si_{13}O_2N_{21}$ is illustrated in FIG. 3.

The fluorescent substance of the present invention can be identified by X-ray diffraction or neutron diffraction. The present invention includes not only a fluorescent substance exhibiting the same XRD profile as $Sr_3Al_3Si_{13}O_2N_{21}$, but also a compound in which the constituting elements of $Sr_3Al_3Si_{13}O_2N_{21}$ are replaced with other elements so as to change the lattice constants in the particular ranges. For example, the fluorescent substance according to the present invention includes a compound having the $Sr_3Al_3Si_{13}O_2N_{21}$ matrix crystal in which Sr is replaced with the element M and/or the luminescence center element R; Si is replaced with one or more elements selected from the group of tetravalent elements such as Ge, Sn, Ti, Zr and Hf; Al is replaced with one or more elements selected from the group of trivalent elements such as B, Ga, In, Sc, Y, La, Gd and Lu; and O or N is replaced with one or more elements selected from the group consisting of O, N and C. Further, Al and Si may be substituted with each other and, at the same time, O and N may be substituted with each other. Examples of that compound include $Sr_3Al_2Si_{14}ON_{22}$, $Sr_3AlSi_{15}N_{23}$, $Sr_3Al_4Si_{12}O_3N_{20}$, $Sr_3Al_5Si_{11}O_4N_{19}$ and $Sr_3Al_6Si_{10}O_5N_{18}$. These compounds have crystal structures belonging to the same group as $Sr_3Al_3Si_{13}O_2N_{21}$.

In the case where the crystal is slightly fused, it can be judged whether the fused crystal belongs to the same group as $Sr_3Al_3Si_{13}O_2N_{21}$ or not by the following simple method. The XRD profile of the modified crystal is measured, and the positions of the diffraction peaks are compared with those in the XRD profile of $Sr_3Al_3Si_{13}O_2N_{21}$. As a result, if the positions of the main peaks are identical, their crystal structures can be regarded as the same. As the main peaks for comparison, it is preferred to select about 10 peaks having strong diffraction intensity.

The fluorescent substance as an embodiment of the present invention can be synthesized from starting materials, which are, for example, a nitride of the element M or a carbide thereof such as cyanamide; nitrides, oxides or carbides of the element $M^1$ such as Al and the element $M^2$ such as Si; and an oxide, nitride or carbonate of the luminescence center element R. In the case where Sr as the element M and Eu as the luminescence center element R are intended to be incorporated, it is possible to adopt $Sr_3N_2$, AlN, $Si_3N_4$, $Al_2O_3$ and EuN as the starting materials. It is also possible to use $Ca_3N_2$, $Ba_3N_2$, $Sr_2N$, SrN or mixtures thereof in place of $Sr_3N_2$. These materials are weighed and mixed so that the aimed composition can be obtained, and then the mixture is fired to prepare the aimed fluorescent substance. The materials are mixed, for example, in a mortar in a glove box. The mixture can be fired in a crucible made of boron nitride, silicon nitride, silicon carbide, carbon, aluminum nitride, SiAlON, aluminum oxide, molybdenum or tungsten.

The mixture of the starting materials is fired for a predetermined time to prepare a fluorescent substance having the aimed composition. The firing is preferably carried out under a pressure more than the atmospheric pressure. In order to prevent the silicon nitride from decomposing at a high temperature, the pressure is preferably not less than 5 atmospheres. The firing temperature is preferably in the range of 1500 to 2000° C., more preferably in the range of 1800 to 2000° C. If the temperature is less than 1500° C., it is often difficult to obtain the aimed fluorescent substance. On the other hand, if the temperature is more than 2000° C., there is a fear that the materials or the product may be sublimated. Further, since the material AlN is liable to be oxidized, the firing is preferably carried out under $N_2$ atmosphere. In that case, $N_2$—$H_2$ mixed gas atmosphere is also usable.

The fired product in the form of powder is then subjected to after-treatment such as washing, if necessary, to obtain a fluorescent substance as an embodiment of the present invention. The washing can be performed, for example, by the use of pure water or acid.

The fluorescent substance as an embodiment of the present invention can be utilized in a white LED as well as a green LED. In order to obtain white emission, the above fluorescent substance is used in combination with plural fluorescent substances emitting luminescence in other wavelength ranges. For example, two or more fluorescent substances emitting red, yellow (or green) and blue luminescence under the excitation with ultraviolet light can be employed in combination. Further, the fluorescent substance of the present invention can be combined with a fluorescent substance emitting yellow light when excited with blue light and, if necessary, also with a fluorescent substance emitting red light. The fluorescent substances thus combined can be excited with blue light to obtain white emission.

The fluorescent substance according to the present invention can be used in any conventionally known light-emitting device. FIG. 1 is a schematic cross-sectional view of the light-emitting device as an embodiment of the present invention.

In the light-emitting device shown in FIG. 1, a resin stem 200 comprises leads 201 and 202 molded as parts of a lead frame, and a resin member 203 formed by unified molding together with the lead frame. The resin member 203 gives a concavity 205 in which the top opening is larger than the bottom. On the inside wall of the concavity, a reflective surface 204 is provided.

At the center of the nearly circular bottom of the concavity 205, a light-emitting chip 206 is mounted with Ag paste or the like. Examples of the light-emitting chip 206 include a light-emitting diode and a laser diode. The light-emitting chip may emit ultraviolet light. There is no particular restriction on the light-emitting chip. Accordingly, it is also possible to adopt a chip capable of emitting blue, bluish violet or near ultraviolet light as well as ultraviolet light. For example, semiconductor light-emitting elements such as GaN can be used. The electrodes (not shown) of the light-emitting chip 206 are connected to the leads 201 and 202 by way of bonding wires 207 and 208 made of Au or the like, respectively. The positions of the leads 201 and 202 can be adequately changed.

In the concavity 205 of the resin member 203, a phosphor layer 209 is provided. For forming the phosphor layer 209, a fluorescent substance 210 as an embodiment of the present invention may be dispersed or precipitated in a resin layer 211 made of silicone resin or the like in an amount of 5 to 50 wt. %. The fluorescent substance of the present invention comprises an oxynitride matrix having high covalency, and hence is generally so hydrophobic that it has good compatibility with the resin. Accordingly, scattering at the interface between the resin and the fluorescent substance is prevented enough to improve the light-extraction efficiency.

The light-emitting chip 206 may be a flip chip type in which an n-type electrode and a p-type one are placed on the same plane. This chip can avoid troubles concerning the wires, such as disconnection or dislocation of the wires and light-absorption by the wires. In that case, therefore, a semiconductor light-emitting device excellent both in reliability and in luminance can be obtained. Further, it is also possible to employ an n-type substrate in the light-emitting chip 206 so as to produce a light-emitting device constituted as described below. In the device, an n-type electrode is formed on the back surface of the n-type substrate while a p-type electrode is formed on the top surface of the semiconductor layer on the substrate. One of the n-type and p-type electrodes is mounted on one of the leads, and the other electrode is connected to the other lead by way of a wire. The size of the light-emitting chip 206 and the dimension and shape of the concavity 205 can be properly changed.

The light-emitting device as an embodiment of the present invention is not restricted to the package cup type as shown in FIG. 1, and can be freely applied to any type of devices. For example, even if the fluorescent substance of the present invention is used in a shell-type LED or in a surface-mount type LED, the same effect of the present invention can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

EXAMPLES

The present invention is further explained by the following examples, which by no means restrict the present invention.

Example 1

As the starting materials, $Sr_3N_2$, EuN, $Si_3N_4$, $Al_2O_3$ and AlN in the amounts of 2.676 g, 0.398 g, 6.080 g, 0.680 g and 0.683 g, respectively, were weighed and dry-mixed in an agate mortar in a vacuum glove box. The mixture was placed in a BN crucible and then fired at 1850° C. for 4 hours under 7.5 atm of $N_2$ atmosphere, to synthesize a fluorescent substance whose designed composition was $(Sr_{0.92}Eu_{0.08})_3Al_3Si_{13}O_2N_{21}$.

The fluorescent substance obtained by firing was in the form of yellowish green powder, and was observed to emit green luminescence when excited by black light.

Example 2

As the starting materials, $Sr_3N_2$, $Ca_3N_2$, EuN, $Si_3N_4$, $Al_2O_3$ and AlN in the amounts of 2.408 g, 0.136 g, 0.398 g, 6.080 g, 0.680 g and 0.683 g, respectively, were weighed and dry-mixed in an agate mortar in a vacuum glove box. The mixture was placed in a BN crucible and then fired at 1850° C. for 4 hours under 7.5 atm of $N_2$ atmosphere, to synthesize a fluorescent substance whose designed composition was $(Sr_{0.828}Ca_{0.092}Eu_{0.08})_3Al_3Si_{13}O_2N_{21}$.

The fluorescent substance obtained by firing was in the form of yellowish green powder, and was observed to emit green luminescence when excited by black light.

Example 3

As the starting materials, $Sr_3N_2$, $Ca_3N_2$, EuN, $Si_3N_4$, $Al_2O_3$ and AlN in the amounts of 2.141 g, 0.273 g, 0.398 g, 6.080 g, 0.680 g and 0.683 g, respectively, were weighed and dry-mixed in an agate mortar in a vacuum glove box. The mixture was placed in a BN crucible and then fired at 1850° C. for 4 hours under 7.5 atm of $N_2$ atmosphere, to synthesize a fluorescent substance whose designed composition was $(Sr_{0.736}Ca_{0.184}Eu_{0.08})_3Al_3Si_{13}O_2N_{21}$.

The fluorescent substance obtained by firing was in the form of yellowish green powder, and was observed to emit green luminescence when excited by black light.

Figure 4:
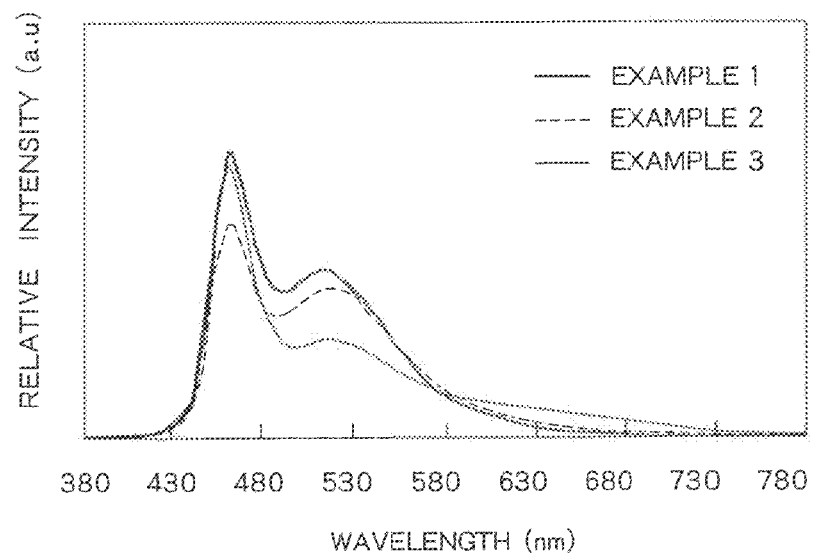
FIG. 4 shows emission spectra given by the fluorescent substances of Examples 1 to 3 under the excitation with light at 458 nm.

Each of the yellowish green powders obtained in Examples 1 to 3 was ground and then excited by means of a light-emitting diode giving an emission peak at 458 nm. The emission spectra obtained thus were shown in FIG. 4. In FIG. 4, the band giving a peak at 458 nm is attributed to reflection of the excitation light. As a result, each yellowish green powder exhibited an emission spectrum of single band in which the peak was positioned in the wavelength range of 515 to 530 nm.

Example 4

As the starting materials, $Sr_3N_2$, EuN, $Si_3N_4$, $Al_2O_3$ and AlN in the amounts of 2.408 g, 0.358 g, 5.893 g, 0.306 g and 0.492 g, respectively, were weighed and dry-mixed in an agate mortar in a vacuum glove box. The mixture was placed in a BN crucible and then fired at 1850° C. for 2 hours under 7.5 atm of $N_2$ atmosphere, to synthesize a fluorescent substance whose designed composition was $(Sr_{0.92}Eu_{0.08})_3Al_2Si_{14}ON_{22}$. The fluorescent substance obtained by firing was in the form of yellowish green powder, and was observed to emit green luminescence when excited by black light.

Example 5

As the starting materials, $Sr_3N_2$, EuN, $Si_3N_4$, $Al_2O_3$ and AlN in the amounts of 2.408 g, 0.358 g, 5.683 g, 0.459 g and 0.553 g, respectively, were weighed and dry-mixed in an agate mortar in a vacuum glove box. The mixture was placed in a BN crucible and then fired at 1850° C. for 4 hours under 7.5 atm of $N_2$ atmosphere, to synthesize a fluorescent substance whose designed composition was $(Sr_{0.92}Eu_{0.08})_3Al_{2.5}Si_{13.5}O_{1.5}N_{21.5}$. The fluorescent substance obtained by firing was in the form of yellowish green powder, and was observed to emit green luminescence when excited by black light.

Example 6

As the starting materials, $Sr_3N_2$, EuN, $Si_3N_4$, $Al_2O_3$ and AlN in the amounts of 2.408 g, 0.358 g, 5.262 g, 0.765 g and 0.676 g, respectively, were weighed and dry-mixed in an agate mortar in a vacuum glove box. The mixture was placed in a BN crucible and then fired at 1850° C. for 4 hours under 7.5 atm of $N_2$ atmosphere, to synthesize a fluorescent substance whose designed composition was $(Sr_{0.92}Eu_{0.08})_3Al_{3.5}Si_{12.5}O_{2.5}N_{20.5}$. The fluorescent substance obtained by firing was in the form of yellowish green powder, and was observed to emit green luminescence when excited by black light.

Example 7

As the starting materials, $Sr_3N_2$, EuN, $Si_3N_4$, $Al_2O_3$ and AlN in the amounts of 2.408 g, 0.358 g, 5.388 g, 0.673 g and 0.639 g, respectively, were weighed and dry-mixed in an agate mortar in a vacuum glove box. The mixture was placed in a BN crucible and then fired at 1850° C. for 4 hours under 7.5 atm of $N_2$ atmosphere, to synthesize a fluorescent substance whose designed composition was $(Sr_{0.92}Eu_{0.08})_3Al_{3.2}Si_{12.8}O_{2.2}N_{20.8}$. The fluorescent substance obtained by firing was in the form of yellowish green powder, and was observed to emit green luminescence when excited by black light.

Example 8

As the starting materials, $Sr_3N_2$, EuN, $Si_3N_4$, $Al_2O_3$ and AlN in the amounts of 2.356 g, 0.448 g, 5.472 g, 0.612 g and 0.615 g, respectively, were weighed and dry-mixed in an agate mortar in a vacuum glove box. The mixture was placed in a BN crucible and then fired at 1850° C. for 4 hours under 7.5 atm of $N_2$ atmosphere, to synthesize a fluorescent substance whose designed composition was $(Sr_{0.9}Eu_{0.1})_3Al_3Si_{13}O_2N_{21}$. The fluorescent substance obtained by firing was in the form of yellowish green powder, and was observed to emit green luminescence when excited by black light.

Figure 5:
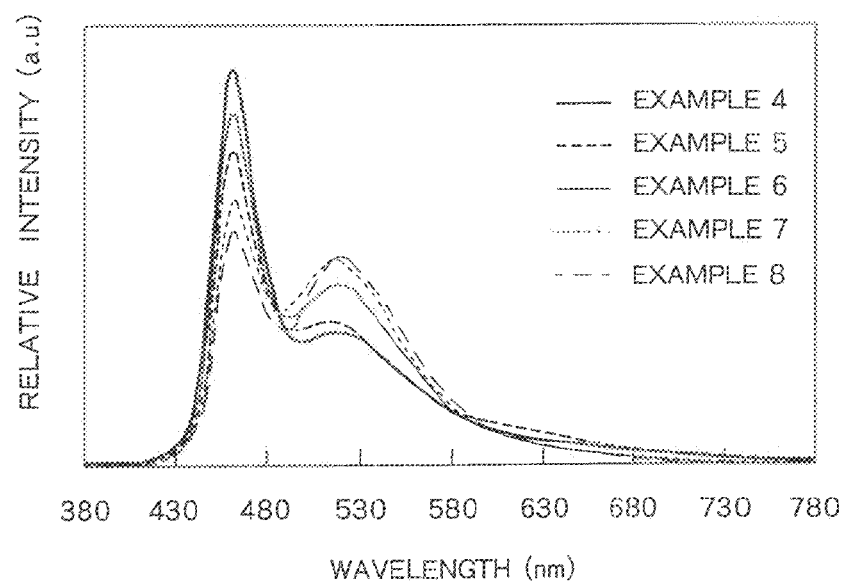
FIG. 5 shows emission spectra given by the fluorescent substances of Examples 4 to 8 under the excitation with light at 460 nm.

Each of the yellowish green powders obtained in Examples 4 to 8 was ground and then excited by means of a light-emitting diode giving an emission peak at 460 nm. The emission spectra obtained thus were shown in FIG. 5. In FIG. 5, the band giving a peak at 460 nm is attributed to reflection of the excitation light. As a result, each yellowish green powder exhibited an emission spectrum of single band in which the peak was positioned in the wavelength range of 515 to 525 nm.

Example 9

As the starting materials, $Sr_2N$, EuN, $Si_3N_4$, $Al_2O_3$ and AlN in the amounts of 2.350 g, 0.358 g, 5.472 g, 0.612 g and 0.615 g, respectively, were weighed and dry-mixed in an agate mortar in a vacuum glove box. The mixture was placed in a BN crucible and then fired at 1850° C. for 4 hours under 7.5 atm of $N_2$ atmosphere, to synthesize a fluorescent substance whose designed composition was $(Sr_{0.92}Eu_{0.08})_3Al_3Si_{13}O_2N_{21}$. The fluorescent substance obtained by firing was in the form of yellowish green powder, and was observed to emit green luminescence when excited by black light.

Example 10

As the starting materials, a mixture of $Sr_2N$ and $Sr_3N_2$ in the ratio of 1:1, EuN, $Si_3N_4$, $Al_2O_3$ and AlN in the amounts of 2.379 g, 0.358 g, 5.472 g, 0.612 g and 0.615 g, respectively, were weighed and dry-mixed in an agate mortar in a vacuum glove box. The mixture was placed in a BN crucible and then fired at 1850° C. for 4 hours under 7.5 atm of $N_2$ atmosphere, to synthesize a fluorescent substance whose designed composition was $(Sr_{0.92}Eu_{0.08})_3Al_3Si_{13}O_2N_{21}$. The fluorescent substance obtained by firing was in the form of yellowish green powder, and was observed to emit green luminescence when excited by black light.

Example 11

As the starting materials, $Sr_2N$, $EuN$, $Si_3N_4$, $Al_2O_3$ and AlN in the amounts of 2.325 g, 0.403 g, 5.472 g, 0.612 g and 0.615 g, respectively, were weighed and dry-mixed in an agate mortar in a vacuum glove box. The mixture was placed in a BN crucible and then fired at 1850° C. for 4 hours under 7.5 atm of $N_2$ atmosphere, to synthesize a fluorescent substance whose designed composition was $(Sr_{0.91}Eu_{0.09})_3Al_3Si_{13}O_2N_{21}$. The fluorescent substance obtained by firing was in the form of yellowish green powder, and was observed to emit green luminescence when excited by black light.

Example 12

As the starting materials, $Sr_2N$, $EuN$, $Si_3N_4$, $Al_2O_3$ and AlN in the amounts of 2.299 g, 0.448 g, 5.472 g, 0.612 g and 0.615 g, respectively, were weighed and dry-mixed in an agate mortar in a vacuum glove box. The mixture was placed in a BN crucible and then fired at 1850° C. for 4 hours under 7.5 atm of $N_2$ atmosphere, to synthesize a fluorescent substance whose designed composition was $(Sr_{0.9}Eu_{0.1})_3Al_3Si_{13}O_2N_{21}$.

Figure 6:
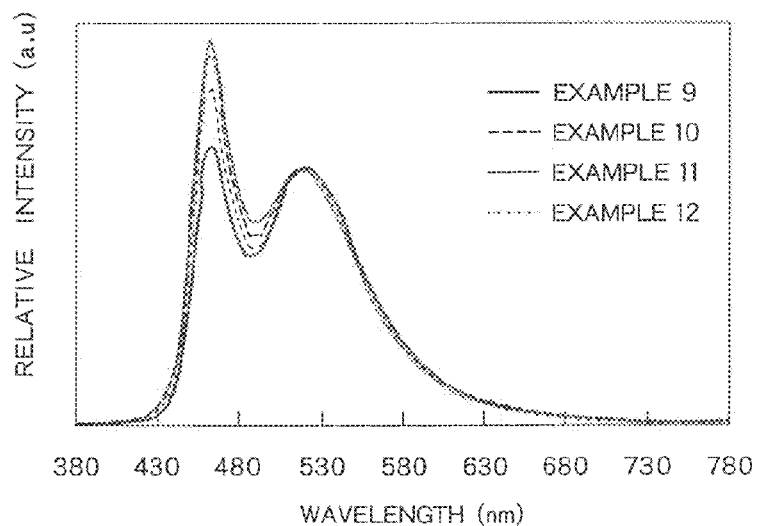
FIG. 6 shows emission spectra given by the fluorescent substances of Examples 9 to 12 under the excitation with light at 460 nm.

Each of the yellowish green powders obtained in Examples 9 to 12 was ground and then excited by means of a light-emitting diode giving an emission peak at 460 nm. The emission spectra obtained thus were shown in FIG. 6. In FIG. 6, the band giving a peak at 460 nm is attributed to reflection of the excitation light. As a result, each yellowish green powder exhibited an emission spectrum of single band in which the peak was positioned in the wavelength range of 515 to 525 nm.

The yellowish green powders of Examples 1, 5 and 7 were chemically analyzed, and the results were as set forth in Table 2. In Table 2, the values x, y, z, u, w and u-w in the aforementioned formula (1) were presented.

With respect to each of the yellowish green powders obtained in Examples 1 to 12, the absorption ratio, quantum efficiency and emission efficiency under the excitation at 458 nm or at 460 nm were listed in Table 3. The results shown in Tables 2 and 3 indicate that the fluorescent substances according to the present invention exhibited high quantum efficiencies. Particularly in the case where z was 0.2 or more, the absorption ratio was found to be also increased. Accordingly, that composition was found to be favorable.

TABLE 2

|  | Sr | Eu | Sr + Eu | y | Al | Si | Al + Si | z | O | u | N | w | u-w |
|---|---|---|---|---|---|---|---|---|---|---|---|---|---|
| Ex. 1 | 2.63 | 0.24 | 2.87 | 0.13 | 2.91 | 13.1 | 16.0 | −0.09 | 2.2 | 0.2 | 21 | 0 | 0.2 |
| Ex. 5 | 2.84 | 0.25 | 3.08 | −0.08 | 3.51 | 12.5 | 16.0 | 0.51 | 2.7 | 0.7 | 21 | 0 | 0.7 |
| Ex. 7 | 2.70 | 0.24 | 2.94 | 0.06 | 3.24 | 12.8 | 16.0 | 0.24 | 2.3 | 0.3 | 21 | 0 | 0.3 |

TABLE 3

|  | Peak wavelength | Ab. ratio*1 | Quantum ef.*2 | Emission ef.*3 |
|---|---|---|---|---|
| Ex. 1 | 516 nm | 0.82 | 0.72 | 0.59 |
| Ex. 2 | 517 nm | 0.87 | 0.67 | 0.58 |
| Ex. 3 | 524 nm | 0.83 | 0.65 | 0.54 |
| Ex. 4 | 516 nm | 0.78 | 0.65 | 0.50 |
| Ex. 5 | 518 nm | 0.85 | 0.65 | 0.55 |
| Ex. 6 | 518 nm | 0.80 | 0.67 | 0.54 |
| Ex. 7 | 515 nm | 0.87 | 0.70 | 0.61 |
| Ex. 8 | 521 nm | 0.88 | 0.68 | 0.60 |
| Ex. 9 | 522 nm | 0.86 | 0.68 | 0.58 |
| Ex. 10 | 520 nm | 0.89 | 0.65 | 0.58 |
| Ex. 11 | 520 nm | 0.85 | 0.69 | 0.59 |
| Ex. 12 | 522 nm | 0.87 | 0.66 | 0.57 |

Remarks)
Ab. ratio*1: absorption ratio
Quantum ef.*2: quantum efficiency
Emission ef.*3: emission efficiency As shown in Table 3, all the yellowish green powders of Examples 1 to 12 were fluorescent substances that gave off luminescence in the wavelength range of 490 to 580 nm when excited with light of 250 to 500 nm. Their absorption ratios, quantum efficiencies and emission efficiencies were equal or superior to those of conventional yellowish green fluorescent substances such as $(Ba,Sr)_2SiO_4:Eu$.

JP-A 2005-255895(KOKAI) describes that an Eu-activated β-SiAlON phosphor exhibits the absorption ratio of 65%, the inner quantum efficiency of 53% and the emission efficiency of 35% under the excitation at 450 nm. By comparison between the emission efficiency of the conventional fluorescent substance and that of the fluorescent substance according to the present invention under the same excitation wavelength condition, it is clear that the green fluorescent substance of the present invention has superior characteristics.

Even when the excitation wavelength was changed to 254 nm, 365 nm, 390 nm or 460 nm, the luminescence was observed in the same wavelength range. If the excitation wavelength is too short, the Stokes shift causes a great loss. On the other hand, however, if the excitation wavelength is too long, the excitation efficiency is lowered. Accordingly, the fluorescent substance of the present invention is preferably excited in the wavelength range of 380 to 460 nm when employed in a light-emitting device. The luminescence preferably has a peak at the wavelength of 560 nm or shorter.

Comparative Example 1

As the starting materials, $SrCO_3$, AlN, $Si_3N_4$ and $Eu_2O_3$ in the amounts of 16.298 g, 4.919 g, 26.659 g, and 1.689 g, respectively, were weighed and mixed in dehydrated isopropanol (hereinafter referred to as IPA) with a ball-mill for 2 hours, and then dried by a mantle heater to evaporate and remove the IPA. Thereafter, the mixture was passed through a sieve of 300 μm mesh, to obtain material powder. The obtained material powder was made to fall naturally through a sieve of 500 to 1000 μm mesh, and placed in a crucible made of boron nitride. The material powder in the crucible was fired at 1850° C. for 6 hours under 7 atm of $N_2$ atmosphere, to synthesize a fluorescent substance.

The fluorescent substance obtained by firing was a mixture of two sintered powders having different colors, namely, a white sintered powder and a yellowish green one. When excited by black light, the white and yellowish green powders were observed to emit blue and green luminescence, respectively.

Comparative Example 2

As the starting materials, $SrCO_3$, AlN, $Si_3N_4$ and $Eu_2O_3$ in the amounts of 14.940 g, 4.509 g, 28.296 g, and 1.548 g, respectively, were weighed and mixed in dehydrated IPA with a ball-mill for 2 hours, and then dried by a mantle heater to evaporate and remove the IPA. Thereafter, the mixture was passed through a sieve of 300 μm mesh, to obtain material powder. The obtained material powder was made to fall naturally through a sieve of 500 to 1000 μm mesh, and placed in a crucible made of boron nitride. The material powder in the crucible was fired at 1800° C. for 16 hours under 7 atm of $N_2$ atmosphere, to synthesize a fluorescent substance.

The fluorescent substance obtained by firing was a mixture of two sintered powders having different colors, namely, a white sintered powder and a yellowish green one. When excited by black light, the white and yellowish green powders were observed to emit blue and green luminescence, respectively.

Comparative Example 3

As the starting materials, $SrCO_3$, AlN, $Si_3N_4$ and $Eu_2O_3$ in the amounts of 25.097 g, 8.198 g, 46.77 g, and 5.279 g, respectively, were weighed and mixed in dehydrated IPA with a ball-mill for 2 hours, and then dried by a mantle heater to evaporate and remove the IPA. The obtained material powder was placed in a crucible made of carbon, and fired at 1750° C. for 36 hours under 7 atm of $N_2$ atmosphere, to synthesize a fluorescent substance.

The fluorescent substance obtained by firing was a mixture of three sintered powders having different colors, namely, a white sintered powder, a red one and a yellowish green one. When excited by black light, the white, red and yellowish green powders were observed to emit blue, red and green luminescence, respectively.

Comparative Example 4

As the starting materials, $SrCO_3$, AlN, $Si_3N_4$ and $Eu_2O_3$ in the amounts of 25.097 g, 8.198 g, 46.77 g, and 5.279 g, respectively, were weighed and mixed in dehydrated IPA with a ball-mill for 2 hours, and then dried by a mantle heater to evaporate and remove the IPA. The obtained material powder was placed in a crucible made of carbon, and fired at 1750° C. for 48 hours under 7 atm of $N_2$ atmosphere, to synthesize a fluorescent substance.

The fluorescent substance obtained by firing was a mixture of three sintered powders having different colors, namely, a white sintered powder, a red one and a yellowish green one. When excited by black light, the white, red and yellowish green powders were observed to emit blue, red and green luminescence, respectively.

The yellowish green powders of Comparative Examples 1 to 4 were chemically analyzed, and the results were as set forth in Table 4. In Table 4, the values x, y, z, u, w and u-w in the aforementioned formula (1) were presented. As shown in Table 4, all the values were out of the ranges regulated in the present invention.

TABLE 4

|  | Sr | Eu | Sr + Eu | y | Al | Si | Al + Si | z | O | u | N | w | u-w |
|---|---|---|---|---|---|---|---|---|---|---|---|---|---|
| Com. 1 | 2.75 | 0.24 | 2.81 | 0.19 | 2.96 | 13.0 | 16.0 | −0.04 | 2.4 | 0.4 | 26 | 5 | −4.6 |
| Com. 2 | 2.38 | 0.22 | 2.60 | 0.40 | 2.38 | 13.6 | 16.0 | −0.62 | 1.6 | −0.4 | 23 | 2 | −2.4 |
| Com. 3 | 2.37 | 0.45 | 2.82 | 0.18 | 3.08 | 12.9 | 16.0 | 0.08 | 2.8 | 0.8 | 20 | 1 | −0.2 |
| Com. 4 | 2.39 | 0.42 | 2.81 | 0.19 | 3.08 | 12.9 | 16.0 | 0.08 | 2.5 | 0.5 | 21 | 0 | 0.5 |

With respect to each of the yellowish green powders obtained in Comparative Examples 1 to 4, the absorption ratio, quantum efficiency and emission efficiency under the excitation at 457 nm were as set forth in Table 5. Each of the quantum efficiencies shown in the table was lower than that given by the fluorescent substance of the present invention, and therefore it is clear that the present invention is remarkably effective in improving the quantum efficiency.

TABLE 5

|  | Peak wavelength | Ab. ratio[*1] | Quantum ef.[*2] | Emission ef.[*3] |
|---|---|---|---|---|
| Com. 1 | 520 nm | 0.95 | 0.63 | 0.60 |
| Com. 2 | 520 nm | 0.85 | 0.60 | 0.51 |
| Com. 3 | 513 nm | 0.86 | 0.41 | 0.35 |
| Com. 4 | 523 nm | 0.89 | 0.34 | 0.30 |

Figure 7:
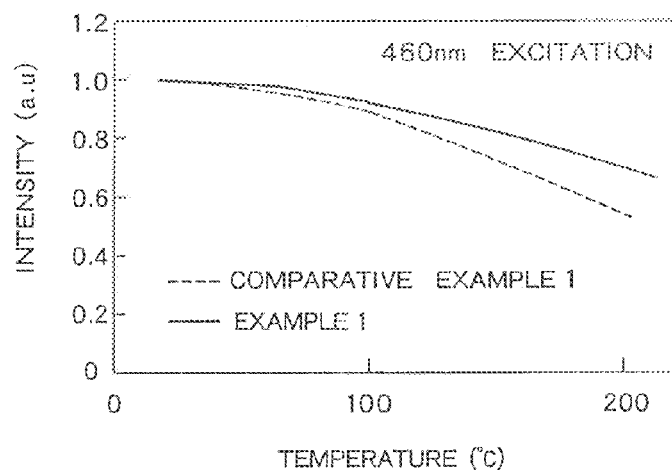
FIG. 7 is a graph showing temperature characteristics of emission intensity given by the fluorescent substances of Example 1 and Comparative Example 1 under the excitation with light at 457 nm.

Remarks)
Ab. ratio[*1]: absorption ratio
Quantum ef.[*2]: internal quantum efficiency
Emission ef.[*3]: external quantum efficiency The fluorescent substances of Example 1 and Comparative Example 1 were excited while being heated from room temperature to 200° C. by a heater, and thereby the changes of their emission spectra were observed. The excitation was carried out by the use of a light-emitting diode giving an emission peak at 457 nm. FIG. 7 shows the temperature dependence of peak intensity in each emission spectrum.

FIG. 7 indicates that the emission intensity of the fluorescent substance of Example 1 was less lowered than that of Comparative Example 1 even at such a high temperature as 200° C. Consequently, it was revealed that the fluorescent substance according to the present invention was remarkably improved in the temperature characteristics. Although FIG. 7 shows the results concerning only the fluorescent substance of Example 1, it was also confirmed that the fluorescent substances of other Examples had temperature characteristics superior to those of Comparative examples.

The light-emitting device shown in FIG. 1 was produced by the use of the fluorescent substance of Example 1. The produced device was worked in the temperature range of room temperature to 150° C., and thereby the temperature dependence of efficiency was measured. As a result, it was found that the efficiency was scarcely degraded in this temperature range. It was, therefore, confirmed that the light-emitting device employing the fluorescent substance of the present invention had excellent temperature characteristics.

Example 13

Figure 8:
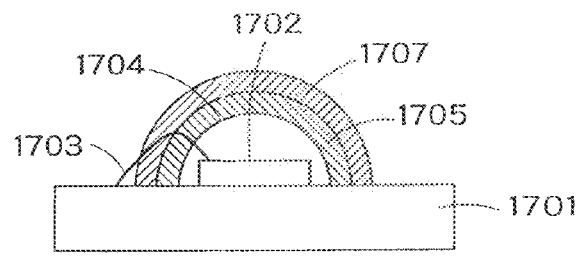
FIG. 8 is a schematic cross-sectional view of the light-emitting device in Example 13, wherein 1701 is an AlN substrate, 1702 is a light-emitting diode, 1703 is wires, 1704 is a transparent resin layer, 1705 is a red fluorescent substance layer, and 1707 is a green fluorescent substance layer.
Figure 9:
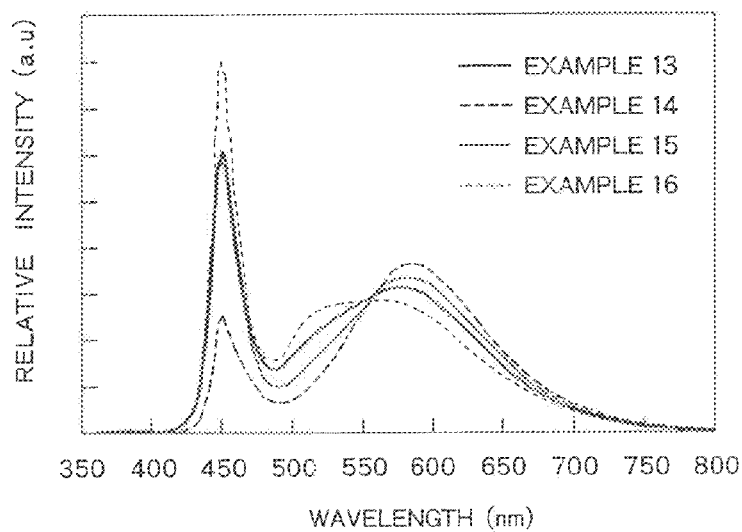
FIG. 9 shows emission spectra given by the light-emitting devices in Examples 13 to 16.

A light-emitting diode giving an emission peak at 449 nm was soldered on an 8 mm-square AlN package, and was connected to electrodes by way of gold wires. The light-emitting diode was then domed with transparent resin, and the dome was coated with a layer of transparent resin containing 40 wt. % of red fluorescent substance $(Ba_{0.1}Sr_{0.8}Ca_{0.1})_2SiO_4$:$Eu^{2+}$ giving an emission peak at 585 nm. Further, another layer of transparent resin containing 30 wt. % of the fluorescent substance of Example 1 was provided thereon. Thus, the light-emitting device shown in FIG. 8 was produced. The produced device was placed in an integrating sphere, and then worked under the conditions of 20 mA and 3.1 V. The emitted light was observed to have the chromaticity of (0.333, 0.334), the color temperature of 5450K, the luminous flux efficiency of 63.41 m/W and Ra=83.

Example 14

A light-emitting diode giving an emission peak at 449 nm was soldered on an 8 mm-square AlN package, and was connected to electrodes by way of gold wires. The light-emitting diode was then domed with transparent resin, and the dome was coated with a layer of transparent resin containing 60 wt. % of red fluorescent substance $(Ba_{0.1}Sr0.8Ca_{0.1})_2SiO_4$:$Eu^{2+}$ giving an emission peak at 585 nm. Further, another layer of transparent resin containing 30 wt. % of the fluorescent substance of Example 1 was provided thereon. Thus, a light-emitting device was produced. The produced device was placed in an integrating sphere, and then worked under the conditions of 20 mA and 3.1 V. The emitted light was observed to have the chromaticity of (0.423, 0.399), the color temperature of 3200K, the luminous flux efficiency of 60.0 lm/W and Ra=70.

Example 15

A light-emitting diode giving an emission peak at 449 nm was soldered on an 8 mm-square AlN package, and was connected to electrodes by way of gold wires. The light-emitting diode was then domed with transparent resin, and the dome was coated with a layer of transparent resin containing 40 wt. % of red fluorescent substance $(Ba_{0.1}Sr_{0.8}Ca_{0.1})_2SiO_4$:$Eu^{2+}$ giving an emission peak at 585 nm. Further, another layer of transparent resin containing 20 wt. % of the fluorescent substance of Example 1 was provided thereon. Thus, a light-emitting device was produced. The produced device was placed in an integrating sphere, and then worked under the conditions of 20 mA and 3.1 V. The emitted light was observed to have the chromaticity of (0.354, 0.329), the color temperature of 4520K, the luminous flux efficiency of 61.6 lm/W and Ra=81.

Example 16

A light-emitting diode giving an emission peak at 449 nm was soldered on an 8 mm-square AlN package, and was connected to electrodes by way of gold wires. The light-emitting diode was then domed with transparent resin, and the dome was coated with a layer of transparent resin containing 30 wt. % of red fluorescent substance $(Ba_{0.1}Sr_{0.8}Ca_{0.1})_2SiO_4$:$Eu^{2+}$ giving an emission peak at 585 nm. Further, another layer of transparent resin containing 30 wt. % of the fluorescent substance of Example 1 was provided thereon. Thus, a light-emitting device was produced. The produced device was placed in an integrating sphere, and then worked under the conditions of 20 mA and 3.1 V. The emitted light was observed to have the chromaticity of (0.298, 0.305), the color temperature of 7800K, the luminous flux efficiency of 62.2 lm/W and Ra=86.

Example 17

Figure 10:
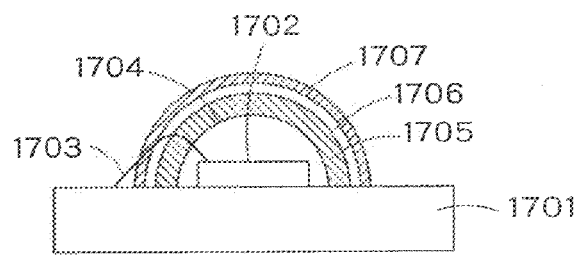
FIG. 10 is a schematic cross-sectional view of the light-emitting device in Example 17, wherein 1701 is an MN substrate, 1702 is a light-emitting diode, 1703 is wires, 1704 is a transparent resin layer, 1705 is a red fluorescent substance layer, 1706 is a transparent resin layer, and 1707 is a green fluorescent substance layer.
Figure 11:
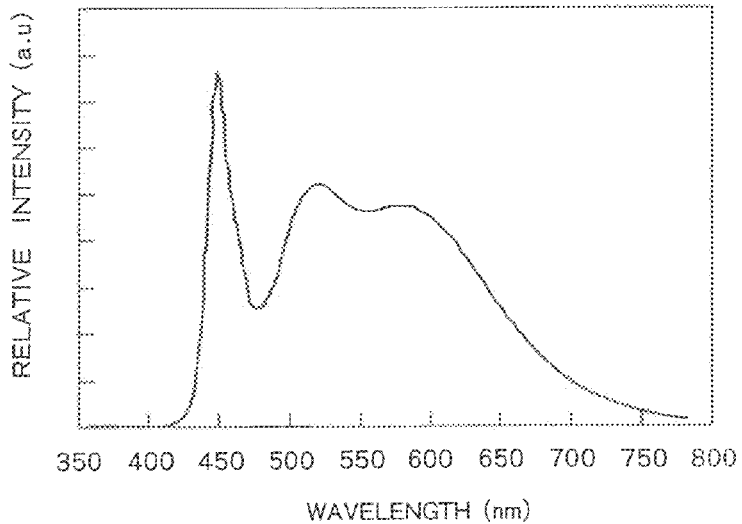
FIG. 11 shows an emission spectrum given by the light-emitting device in Example 17.

A light-emitting diode giving an emission peak at 449 nm was soldered on an 8 mm-square AlN package, and was connected to electrodes by way of gold wires. The light-emitting diode was then domed with transparent resin, and the dome was coated with a layer of transparent resin containing 40 wt. % of red fluorescent substance $(Sr_{0.7}Ca_{0.3})_2SiO_4$:$Eu^{2+}$ giving an emission peak at 600 nm. Further, another layer of transparent resin was provided thereon, and still another layer of transparent resin containing 40 wt. % of the fluorescent substance of Example 1 was furthermore superposed thereon. Thus, the light-emitting device shown in FIG. 10 was produced. The produced device was placed in an integrating sphere, and then worked under the conditions of 20 mA and 3.1 V. The emitted light was observed to have the chromaticity of (0.337, 0.372), the color temperature of 5330K, the luminous flux efficiency of 62.2 lm/W and Ra=87.

The invention claimed is:

1. A fluorescent substance, comprising an inorganic compound which comprises
   a luminescence center element R,
   a metal element M,
   an element $M^1$, which is a trivalent element different from the metal element M,
   an element $M^2$, which is a tetravalent element different from the metal element M, and
   at least one of O and N,
   wherein the metal element M is partly replaced with the luminescence center element R,
   wherein an XRD profile of the fluorescent substance comprises 10 peaks having strong diffraction intensity, and
   wherein a position of the 10 peaks having strong diffraction intensity in the XRD profile of the fluorescent substance are identical to an $Sr_3Al_3Si_{13}O_2N_{21}$ crystal.

2. The fluorescent substance of claim 1, wherein the metal element M is at least one of a IA group element, a IIA group element, a IIIA group element, a IIIB group element, a rare earth element, and a IVA group element,
   the element $M^1$ is at least one of a IIIA group element and a IIIB group element, and
   the element $M^2$ is at least one of a IVA group element and a IVB group element.

3. The fluorescent substance of claim 1, wherein the metal element M is at least one selected from the group consisting of Li, Na, K, Mg, Ca, Sr, Ba, B, Ga, In, Y, Sc, Gd, La, Lu, and Ge,
   the element $M^1$ is at least one selected from the group consisting of Al, B, Ga, In, Sc, Y, La, Gd, and Lu, and
   the element $M^2$ is at least one selected from the group consisting of Si, Ge, Sn, Ti, Zr, and Hf.

4. The fluorescent substance of claim 1, wherein the luminescence center element R is selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi, and Fe.

5. The fluorescent substance of claim 1, which emits luminescence having a peak in a wavelength range of 490 to 580 nm when excited with light in a wavelength range of 250 to 500 nm.

6. The fluorescent substance of claim 1, having a composition of formula (1):

$$(M_{1-x}R_x)_{3-y}Al_{3+z}Si_{13-z}O_{2+u}N_{21-w} \qquad (1),$$

wherein
M is at least one of a IA group element, an IIA group element, an IIIA group element, an IIIB group element, an rare earth element, and an IVA group element;
R is at least one further element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi, and Fe, and
x, y, z, u, and w are numbers satisfying $0<x\leq 1$, $-0.1\leq y\leq 0.15$, $-1\leq z\leq 1$, and $-1<u\text{-}w\leq 1$, respectively,
wherein the substance emits luminescence having a peak in a wavelength range of 490 to 580 nm when excited with light in a wavelength range of 250 to 500 nm.

7. A process for preparing the fluorescent substance of claim 1, the process comprising:
mixing starting materials comprising
a nitride or carbide of the metal element M,
a nitride, oxide, or carbide of said element $M^1$,
a nitride, oxide, or carbide of the element $M^2$, and
an oxide, nitride, or carbonate of the luminescence center element R, to obtain a mixture; and then
firing the mixture.

8. The process of claim 7, wherein the mixed starting materials are fired at a temperature of 1500 to 2000° C. under a pressure of not less than 5 atmospheres.

9. A light-emitting device, comprising a light-emitting element giving off light in the wavelength range of 250 to 500 nm, and
a phosphor layer provided on the light-emitting element, wherein the phosphor layer comprises the fluorescent substance of claim 1.

10. The fluorescent substance of claim 1, wherein R comprises Eu.

11. The fluorescent substance of claim 1, wherein R comprises Mn.

12. A fluorescent substance, comprising an inorganic compound which comprises
a luminescence center element R,
a metal element M,
an element $M^1$, which is a trivalent element different from the metal element M,
an element $M^2$, which is a tetravalent element different from the metal element M, and
at least one of O and N,
wherein the metal element M is partly replaced with the luminescence center element R,
wherein an XRD profile of the fluorescent substance comprises 10 peaks having strong diffraction intensity,
wherein a position of the 10 peaks having strong diffraction intensity in the XRD profile of the fluorescent substance are identical to an $Sr_3Al_3Si_{13}O_2N_{21}$ crystal, and
wherein R comprises Eu and Mn.

13. The fluorescent substance of claim 1, wherein M comprises Li.

14. The fluorescent substance of claim 1, wherein M comprises Na.

15. The fluorescent substance of claim 1, wherein M comprises K.

16. The fluorescent substance of claim 1, wherein M comprises Mg.

17. The fluorescent substance of claim 1, wherein M comprises Ca.

18. The fluorescent substance of claim 1, wherein M comprises Sr.

19. The fluorescent substance of claim 1, wherein M comprises Ba.

20. The fluorescent substance of claim 1, wherein M comprises B.

* * * * *